US010337894B2

(12) United States Patent
Newton et al.

(10) Patent No.: US 10,337,894 B2
(45) **Date of Patent: *Jul. 2, 2019**

(54) SENSOR FOR A FINGERBOARD LATCH ASSEMBLY

(71) Applicant: Salunda Limited, Oxfordshire (GB)

(72) Inventors: John Mark Newton, Oxfordshire (GB); Alan Patrick John Finlay, Herefordshire (GB)

(73) Assignee: Salunda Limited, Oxfordshire (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/006,237

(22) Filed: Jun. 12, 2018

(65) Prior Publication Data

US 2018/0292242 A1 Oct. 11, 2018

Related U.S. Application Data

(63) Continuation of application No. 14/856,197, filed on Sep. 16, 2015, now Pat. No. 10,132,660.

(30) Foreign Application Priority Data

Sep. 17, 2014 (GB) .................................. 1416466.9
Feb. 13, 2015 (GB) .................................. 1502446.6

(51) Int. Cl.
*F16L 3/00* (2006.01)
*E21B 19/14* (2006.01)
(Continued)

(52) U.S. Cl.
CPC .............. *G01D 11/30* (2013.01); *E21B 19/14* (2013.01); *E21B 47/011* (2013.01); *F16L 3/00* (2013.01);
(Continued)

(58) Field of Classification Search
CPC .... H01H 36/0033; G01D 11/30; E21B 19/14; E21B 47/011; E21B 19/143; E21B 47/0905; E21B 19/146; F16L 3/00
(Continued)

(56) References Cited

U.S. PATENT DOCUMENTS 1,804,962 A 5/1931 Lester
3,536,937 A 10/1970 Kenzi
(Continued)

FOREIGN PATENT DOCUMENTS

CN 202520252 U 11/2012
CN 103437723 A 12/2013
(Continued)

OTHER PUBLICATIONS

European Search Report of Application No. 15185729.9 dated Mar. 21, 2016.

(Continued)

*Primary Examiner* — Justin Seo
*Assistant Examiner* — Tania C Courson
(74) *Attorney, Agent, or Firm* — Honigman LLP

(57) ABSTRACT

A sensor assembly is provided for a fingerboard latch assembly that comprises: a latch bracket; bolts for mounting the latch bracket to a fingerboard; a latch; and a bracket pin rotatably supporting the latch on the latch bracket to allow rotation of the latch between an open position and a closed position. The sensor assembly has a mounting arrangement that mounts to the bolts, holding a closed-position proximity sensor probe facing downwardly for sensing proximity of a crank portion of the latch and/or the piston head in the closed position, and also holding an open-position proximity sensor probe facing forwardly for sensing proximity of an arm of the latch in the open position.

11 Claims, 15 Drawing Sheets

(51) Int. Cl.

| | |
|---|---|
| ***E21B 47/01*** | (2012.01) |
| ***E21B 47/09*** | (2012.01) |
| ***G01D 11/30*** | (2006.01) |
| ***H01H 36/00*** | (2006.01) |
| ***H03K 17/95*** | (2006.01) |

(52) U.S. Cl.
CPC ........ *H03K 17/9545* (2013.01); *E21B 19/143* (2013.01); *E21B 19/146* (2013.01); *E21B 47/0905* (2013.01); *H01H 36/0033* (2013.01)

(58) Field of Classification Search
USPC .............. 33/706–708, 1 M; 116/352; 248/65
See application file for complete search history.

(56) References Cited

U.S. PATENT DOCUMENTS

| | | | | |
|---|---|---|---|---|
| 3,799,364 | A | 3/1974 | Kelly et al. | |
| 4,042,123 | A | 8/1977 | Sheldon et al. | |
| 4,609,045 | A | 9/1986 | Rogers | |
| 4,739,264 | A | 4/1988 | Kamiya et al. | |
| 4,741,231 | A | 5/1988 | Patterson et al. | |
| 5,331,152 | A | 7/1994 | Fenton | |
| 5,668,533 | A | 9/1997 | Jackson, Jr. et al. | |
| 6,892,812 | B2 | 5/2005 | Niedermayr et al. | |
| 7,083,007 | B2 | 8/2006 | Herst | |
| 8,317,448 | B2 * | 11/2012 | Hankins | E21B 19/14 414/22.63 |
| 8,631,949 | B2 * | 1/2014 | Roodenburg | E21B 19/14 175/85 |
| 9,016,382 | B2 | 4/2015 | Braxton | |
| 9,206,656 | B2 | 12/2015 | Roodenburg et al. | |
| 9,212,778 | B2 | 12/2015 | Winter | |
| 10,041,895 | B2 * | 8/2018 | Pickles | G01D 5/2405 |
| 2005/0092524 | A1 | 5/2005 | Herst | |
| 2006/0249205 | A1 | 11/2006 | Shturman et al. | |
| 2008/0173480 | A1 | 7/2008 | Annaiyappa et al. | |
| 2010/0303586 | A1 | 12/2010 | Hankins et al. | |
| 2012/0038486 | A1 | 2/2012 | Sinclair et al. | |
| 2013/0032405 | A1 | 2/2013 | Braxton | |
| 2013/0168516 | A1 | 7/2013 | Winter | |
| 2017/0306710 | A1 | 10/2017 | Trydal et al. | |
| 2018/0002994 | A1 | 1/2018 | Albanese | |

FOREIGN PATENT DOCUMENTS

| | | | |
|---|---|---|---|
| DE | 3115587 | A1 | 11/1982 |
| EP | 2554784 | A2 | 2/2013 |
| EP | 3009594 | A1 | 4/2016 |
| GB | 1588849 | A | 4/1981 |
| GB | 2175629 | A | 11/1982 |
| WO | 2012012326 | A1 | 1/2012 |
| WO | 2013180727 | A1 | 12/2013 |
| WO | 2015015150 | A1 | 2/2015 |

OTHER PUBLICATIONS

Office Action for U.S. Appl. No. 14/856,197 dated Aug. 10, 2017.
Office Action for U.S. Appl. No. 14/856,197 dated Mar. 22, 2018.
European Search Report for Application 18206031.9 dated Jan. 3, 2019.

* cited by examiner

54
Frequency
÷2
Enable µC
Oscillator
Frequency
Oscillator
Frequency
Enable µC
51
48
Oscillator
Enable
µC
50
47
48
x 4
63
49
1/2 Vcc
50
46
Probe
28,80
45
100

64
53
μC
4-20mA Control
HART Data
Temperature
4-20mA Current Measurement
Reset
52
Counter
Output
Outputs
Outputs
Enable
Osc Enable 1
2-
3-
4-
F Enable 1
2-
3-
4-
54
÷2
51
F Enable
47
Osc Enable
63
Probes
80
28
100

μC 4-20mA Control
58
PWM to V
59
4-20mA Current Control
57
Supply Current Limiter
62
Voltage Regulator
61
Power for μC, Oscillators HART etc.
EMC Protection IECEx Protection
56
4-20mA Wiring
Hart 4-20mA Modem
60
μC HART Data
Processor
70
55

SENSOR FOR A FINGERBOARD LATCH ASSEMBLY

CROSS-REFERENCE TO RELATED APPLICATIONS

This U.S. patent application is a continuation of and claims priority to U.S. Utility application Ser. No. 14/856,197 filed on Sep. 16, 2015 which claims priority to United Kingdom Application Serial No. 1416466.9 filed Sep. 17, 2014 and United Kingdom Application Serial No. 1502446.6 filed Feb. 13, 2015, the disclosure of which is considered part of the disclosure of this application and is hereby incorporated by reference in its entirety relates to a bead seater apparatus and a method for using the same.

TECHNICAL FIELD

The present invention relates to a sensor for a fingerboard latch assembly.

BACKGROUND

Fingerboards are used to store tubulars, for example drill pipes, drill collars and casings, used in the oil and gas industry, for example adjacent to a drilling derrick on an oil or gas rig. An array of horizontally extending fingerboards are provided between which the tubulars are vertically stacked. Latches are used to secure tubulars between the fingerboards. The latches are provided as part of fingerboard latch assemblies mounted to the fingerboards. A fingerboard latch assembly typically comprises: a latch bracket; bolts for mounting the bracket to a fingerboard; a latch; and a bracket pin rotatably supporting the latch on the latch bracket, to allow rotation of the latch between an open position and a closed position. The latch includes an arm extending forwardly from the bracket pin in the closed position and a crank portion for attachment to a piston head, extending rearwardly from the bracket pin in the closed position.

SUMMARY

According to a first aspect of the present invention, there is provided a sensor assembly for a fingerboard latch assembly, the sensor assembly comprising:

a mounting arrangement that is mountable to the fingerboard latch assembly; and at least one sensor probe held by the mounting arrangement, the sensor assembly being configured so that, when mounted, the sensor probe is arranged to sense the position of the latch.

By means of holding the sensor probe on the mounting arrangement that is mountable to the fingerboard latch assembly, the sensor probe may be arranged to sense the position of the latch in a precise and appropriate location.

The at least one sensor probe may comprise at least one proximity sensor probe arranged to sense proximity of a portion of the latch. In this manner, the sensor probe may be arranged to sense when the latch is in a particular position.

In one example, the at least one sensor probe may comprise a closed-position proximity sensor probe. In this case, the sensor assembly may be configured so that, when mounted, the closed-position proximity sensor probe is arranged to sense proximity of the crank portion of the latch and/or the piston head in the closed position. It is advantageous to sense the closed position, because this is the position in which the tubular is safely held. In contrast, if only the open position is sensed then absence of detecting the open position risks a failure if the latch is stuck between the open and closed positions.

Generally, the sensor probe may face downwardly. This allows the sensor assembly to be positioned on top of the fingerboard latch assembly with the sensor probe facing and therefore sensing the crank portion of the latch and/or the piston head. Such a downwardly facing sensor probe may comprise a closed-position proximity sensor probe.

Such a downwardly facing sensor probe may comprise an antenna having a greater extent in a first direction than in a second direction. The first direction may be an axis about which the latch rotates. This allows sensing of the closed position without reduced dependence on movement of the latch in the first direction, thereby increasing the reliability of detection.

In another example, the at least one sensor probe may comprise an open-position proximity sensor probe. In this case, the sensor assembly may be configured so that, when mounted, the open-position proximity sensor probe is arranged to sense proximity of the arm of the latch in the open position.

Generally, the sensor probe may face forwardly. This allows the sensor assembly to be positioned on top of the fingerboard latch assembly with the sensor probe facing and therefore sensing the latch. Such a forwardly facing sensor probe may comprise an open-position proximity sensor probe.

Such a forwardly facing sensor probe may comprise plural antennae that are spaced apart. This allows sensing proximity of arms having different shapes.

Advantageously, the at least one sensor probe may comprises both a closed-position proximity sensor probe and an open-position proximity sensor probe. In this case, the single sensor assembly can determine both positions of the latch. This allows fault detection as the system can measure whether the latch is open, closed, or there is a fault and the latch is stuck between the two states.

The sensor assembly may be mounted to the fingerboard latch assembly by means of a rigid sensor bracket for mounting to a pair of the bolts on opposite sides of the fingerboard latch assembly. This has the advantage of allowing the sensor assembly to be mounted using bolts that may be provided to mount the fingerboard latch assembly to a fingerboard. Furthermore, this provides a rigid and robust mounting for the sensor assembly.

The sensor assembly may further comprise a sensor circuit held by the mounting arrangement and connected to the at least one sensor probe.

The mounting assembly may further comprise a resilient clip arranged to engage the latch bracket for positioning the mounting assembly. This allows the sensor to be mounted in a precise location to an existing fingerboard arrangements without further modification.

The sensor assembly may further comprise a stent held by the mounting arrangement and containing an electrical cable connected to the sensor circuit for connection to an external circuit. In this case, the sensor assembly may be configured so that, when mounted, the stent is positioned extending through an aperture in a latch bracket of the fingerboard latch assembly that provides clearance between the latch bracket and the latch. This arrangement allows for safe and efficient routing of the electrical interface cables between the fingerboards and enclosure.

The or each probe may be an electromagnetic probe. The sensor circuit may comprise an oscillator circuit, optionally a marginal oscillator circuit, arranged to drive oscillation in the at least one sensor probe, and a detection circuit arranged to detect at least one characteristic of the oscillation.

The sensor assembly may be mounted to a fingerboard latch assembly that comprises: a latch bracket; bolts for mounting the bracket to a fingerboard; a latch; and a bracket pin rotatably supporting the latch on the latch bracket to allow rotation of the latch between an open position and a closed position. The latch may include an arm extending forwardly from the bracket pin in the closed position and a crank portion for attachment to a piston head, extending rearwardly from the bracket pin in the closed position.

According to a second aspect of the present invention, there is provided a sensor system for a fingerboard latch assembly that comprises a latch, the sensor system comprising:

a sensor probe arranged to sense the position of the latch;

a sensor circuit connected to the at least one sensor probe and arranged to derive a signal representing the position of the latch; and a processor arranged to determine at least one parameter of the motion of the latch from the signal representing the position of the latch.

Thus, the sensor system provides at t least one parameter of the motion, for example speed, acceleration, overshoot, vibration and offsets.

The processor may be arranged to analyze the determined parameter of the motion of the latch to predict failure of the latch. This is useful information for performing predictive maintenance.

BRIEF DESCRIPTION OF THE DRAWINGS

Embodiments of the present invention will now be described by way of non-limitative example with reference to the accompanying drawings, of which

DESCRIPTION

Figure 1:
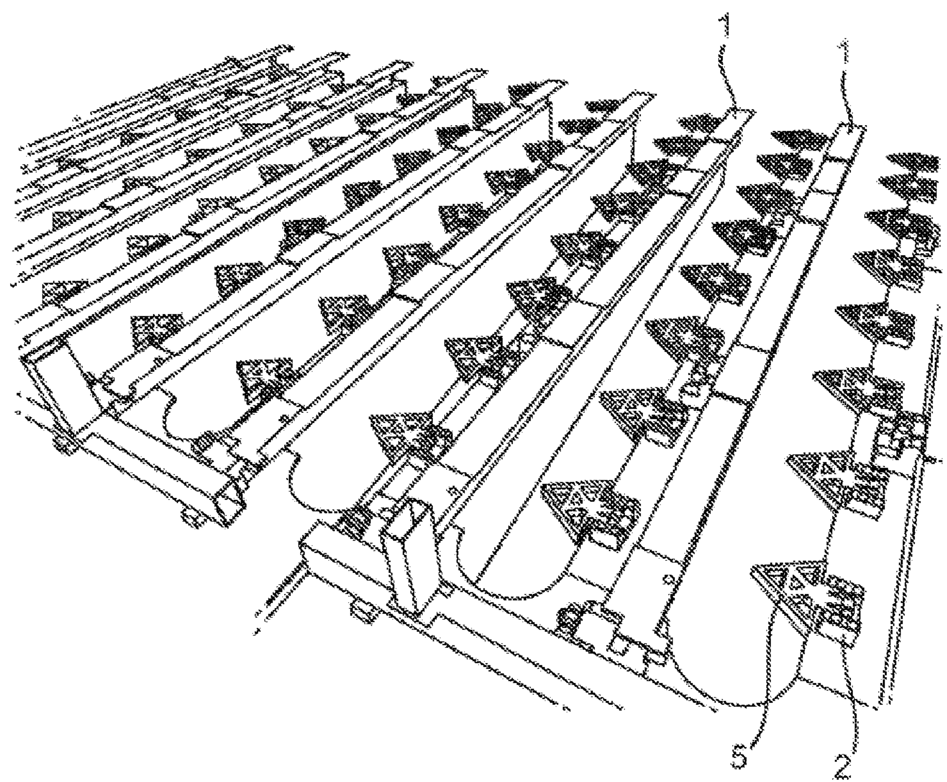
FIG. 1 is a photograph illustrating the typical configuration of a standard fingerboard array (Prior Art)
Figure 2:
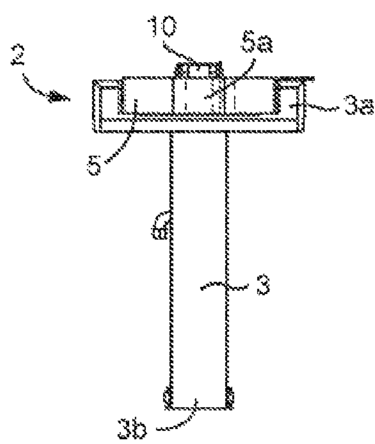
FIG. 2 is a rear view of the first latch assembly (Prior Art)
Figure 3:
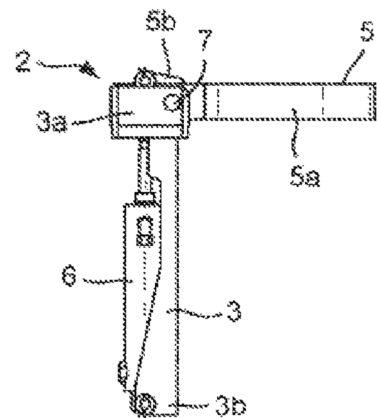
FIG. 3 is a side view of the first latch assembly (Prior Art)

FIG. 1 shows the construction of a standard array of fingerboards 1, each with plural latches 5. The latches 5 are provided each as part of respective fingerboard latch assemblies 2 mounted in arrays along the fingerboards 1.

Two types of fingerboard latch assembly 2 will be described, the first type being for retaining a drill collar and the second type being for retaining a drill pipe or casing. The two types of fingerboard latch assembly 2 have a construction that is generally the same, except that the shape of the latch 5 is different, as appropriate to retain different types of tubular, with a corresponding change in width of the latch bracket on which the latch 5 is supported. Therefore a common description using common reference numerals is given. The following description applies equally to both the first and second types of fingerboard latch assembly 2, except where specific reference is made to one of the first and second types.

FIGS. 2 to 5 show a fingerboard latch assembly 2 of the first type and FIGS. 6 to 9 show a fingerboard latch assembly 2 of the second type. The fingerboard latch assembly 2 comprises a latch bracket 3 that comprises a latch bracket head 3*a* and an elongated body 3*b* extending downwardly from the bracket head 3*a*. The fingerboard latch assembly 2 is mounted to a fingerboard 1 using bolts 4 attached through bolt apertures 3*c* in the latch bracket 3. The fingerboard latch assembly 2 also comprises a latch 5 and pneumatic cylinder 6, both secured to the latch bracket 3.

The fingerboard latch assembly 2 further comprises a bracket pin 7 connecting the latch 5 and bracket head 3*a*. The bracket pin 7 provides a pivot point allowing rotation of the latch 5 between an open and closed position.

The latch 5 comprises an arm 5*a* that, in the closed position of the latch 5, extends forwardly from the bracket pin 7 for restraining a tubular. In the open position of the latch 5, the arm 5*a* of the latch 5 extends upwards from the bracket pin 7, allowing removal of a tubular. The arm 5*a* of the latch 5 is a movable metal member that creates the void between the fingerboards 1 for the tubulars to be secured.

The latch 5 also comprises a crank portion 5*b* that extends rearwardly from the bracket pin 7. The latch bracket head 3*a* has an aperture 9 to provide clearance between the latch bracket 3 and the crank portion 5*b*, as the latch 5 rotates.

The pneumatic cylinder 6 comprises a piston head 10 which is connected to the crank portion 5*b* by way of a latch/cylinder pin 11. A split pin 12 prevents the latch/cylinder pin 11 from falling out of the piston head 10, and a washer 13 provides a wear barrier between the split pin 12 and piston head 10. Thus, the pneumatic cylinder 6 drives rotation of the latch 5 between the open and closed positions.

Two types of sensor assembly 14 will be described, the first type of sensor assembly 14 being for the first type of fingerboard latch assembly 2 and the second type of sensor assembly 14 being for the second type of fingerboard latch assembly 2. The two types of sensor assembly 14 have a construction that is generally the same, except that the shape of the sensor bracket 15 is different, as appropriate to fit the different width of the latch bracket head 3*a* on which it is mounted. Therefore a common description using common reference numerals is given. The following description applies equally to both the first and second types of sensor assembly 14, except where specific reference is made to one of the first and second types.

Figure 10:
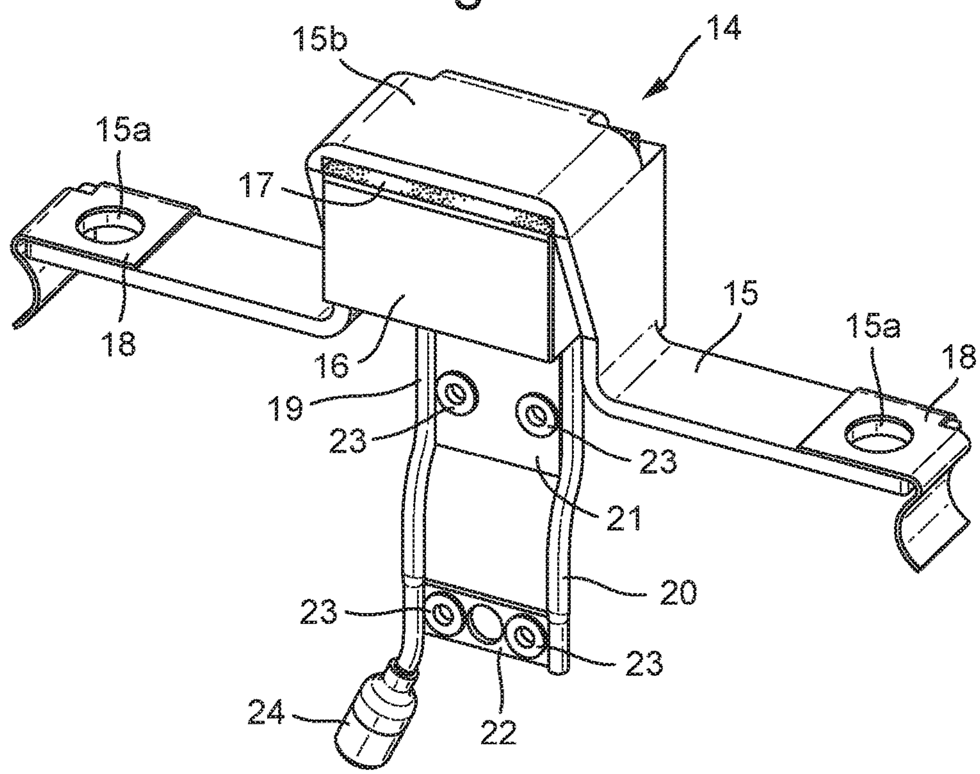
FIG. 10 is a perspective view of the first sensor assembly.
Figure 11:
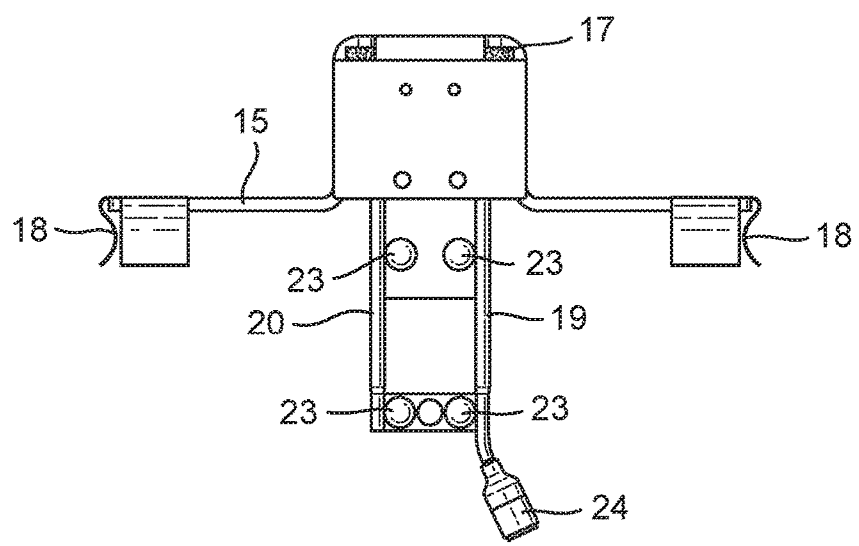
FIG. 11 is a rear orthographic projection of the first sensor assembly.
Figure 12:
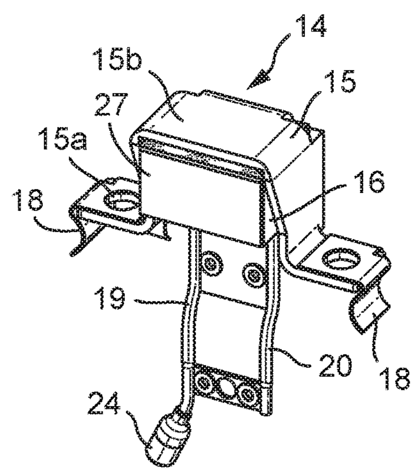
FIG. 12 is a perspective view of the second sensor assembly.
Figure 13:
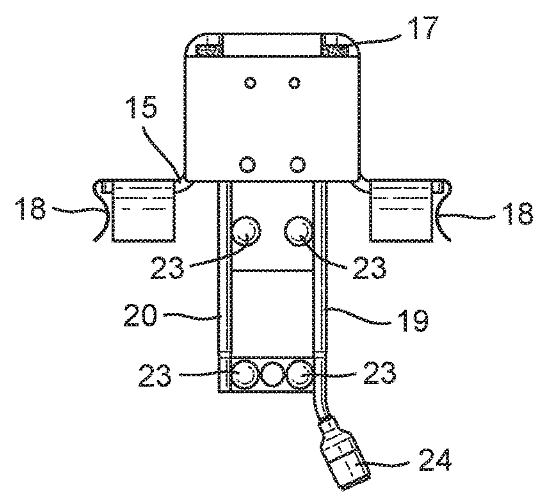
FIG. 13 is a rear view of the second sensor assembly.

FIGS. 10 and 11 illustrate the first type of sensor assembly 14 and FIGS. 12 and 13 illustrate the second type of sensor assembly 14.

The sensor assembly 14 comprises a sensor bracket 15 and an enclosure 16 which holds a sensor circuit 100 as described below. The sensor bracket 15 is a rigid integral member, made of metal, that forms a mounting arrangement for mounting the sensor assembly 14 to the fingerboard latch assembly 2. The sensor bracket 15 has two bolt apertures 15*a* through which the bolts 4 may be fixed for mounting the sensor bracket 15 to the fingerboard latch assembly 2. The bolt apertures 15*a* are arranged on opposite sides of the fingerboard latch assembly 2 and the sensor bracket 15 extends therebetween. The sensor bracket 15 holds the other components of the sensor assembly 14.

The sensor bracket 15 has an arched portion 15*b* extending over, and fixed to, the enclosure 16. The enclosure 16 is arranged in the sensor bracket 15 so that a downwardly facing sensor probe 25 and a forwardly facing sensor probe 26 are formed on surfaces of the enclosure 16 as discussed below. Foam 17 is provided between the sensor bracket 15 and the enclosure 16 to prevent the ingress of water and the action of freezing between the top of the enclosure 16 and the underside of the sensor bracket 15. The sensor assembly 14 also comprises resilient spring clips 18 attached to the sensor bracket 15 around the bolt apertures 15*a*. The resilient spring clips 18 are arranged to engage the latch bracket head 3*a* for positioning the mounting assembly 14. This aids alignment on installation, as described further below.

The sensor assembly 14 includes a stent 19 held by the sensor bracket 15 and containing an electrical cable connected to the sensor circuit 100 for connection to an external circuit. The stent 19 guides the cable through a complex routing, in particular by being configured so that, when mounted, it is positioned extending through the aperture 9 in the latch bracket head 3*a* that provides clearance between the latch 5 and the bracket 3. The sensor assembly 14 also includes a stent support 20 having a configuration matching that of the stent 19 so that, when mounted, the support member 20 also extends through the aperture 9 in the latch bracket head 3*a*. The stent support 20 doubles up the strength of the stent 19 and also provides sensor alignment.

The stent support 20 further comprises a top brace 21 extending between the stent 19 and the support member 20 to mechanically connect the two stents together, to strengthen the stent 19 and stent support 20 and increase the stent assembly resonant frequency. A further bottom brace 22 extends between the stent 19 and the support member 20 to mechanically connect the stent 19 and stent support 20 and to transfer part of the vibration load from the stent 19 to the stent support 20.

The top brace 21 and bottom brace 22 further comprise two vibration dampers 23 mounted to each brace 21 and 22. When the sensor assembly 14 is mounted, the vibration damper engages the bracket 3. This serves the purpose of protecting the stents from the action of metal against metal wear and also provide an element of dampening to vibrations.

The stent 19 also comprises an M12 electrical connector 24 on the end of the cable contained in the stent 19, to provide an electromechanical connection for the cable to an external cable 42.

Figure 14:
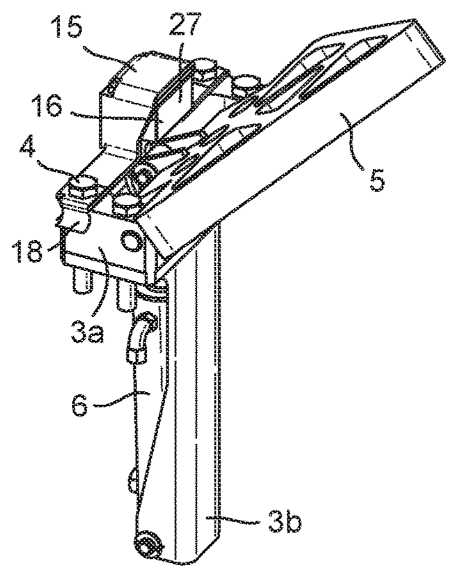
FIG. 14 is a view of the first sensor assembly mounted on the first latch assembly.
Figure 15:
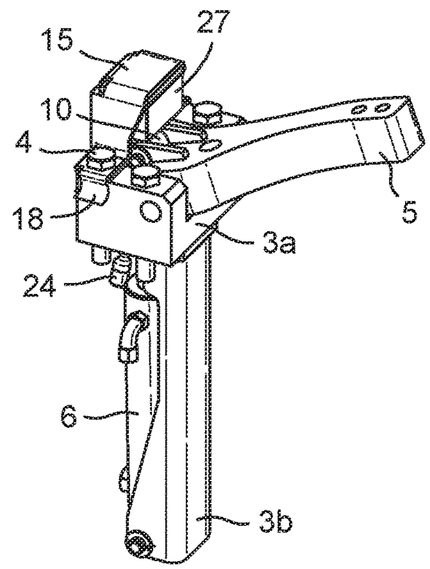
FIG. 15 is a view of the second sensor assembly mounted on the second latch assembly.

FIG. 14 illustrates the first type of sensor assembly 14 mounted on the first type of fingerboard latch assembly and FIG. 15 illustrates the second type of sensor assembly 14 mounted on the second type of fingerboard latch assembly. By means of holding the sensor probes 25 and 26 by the sensor bracket 15 that is mountable to the latch bracket head 3*a* of the fingerboard latch assembly 14, the sensor probes 25 and 26 are mounted in a precise and appropriate location, allowing sensing of the position of the latch. By using the bolts 4, the mounting is reliable and robust.

The downwardly facing sensor probe 25 and the forwardly facing sensor probe 26 are now discussed. In this embodiment, the downwardly facing sensor probe 25 and the forwardly facing sensor probe 26 are inductive probes formed by coils. The downwardly facing sensor probe 25 senses the closed position, which is the position in which the tubular is safely held. If only the open position were to be sensed then absence of detecting the open position risks a failure if the latch is stuck between the open and closed positions. By providing both a downwardly facing sensor probe 25 and a forwardly facing sensor probe 26, the sensor assembly 14 can determine both positions of the latch. This allows fault detection as the system can measure whether the latch 5 is open, closed, or if the latch 5 is stuck between the open and closed states in a fault condition.

Figure 16:
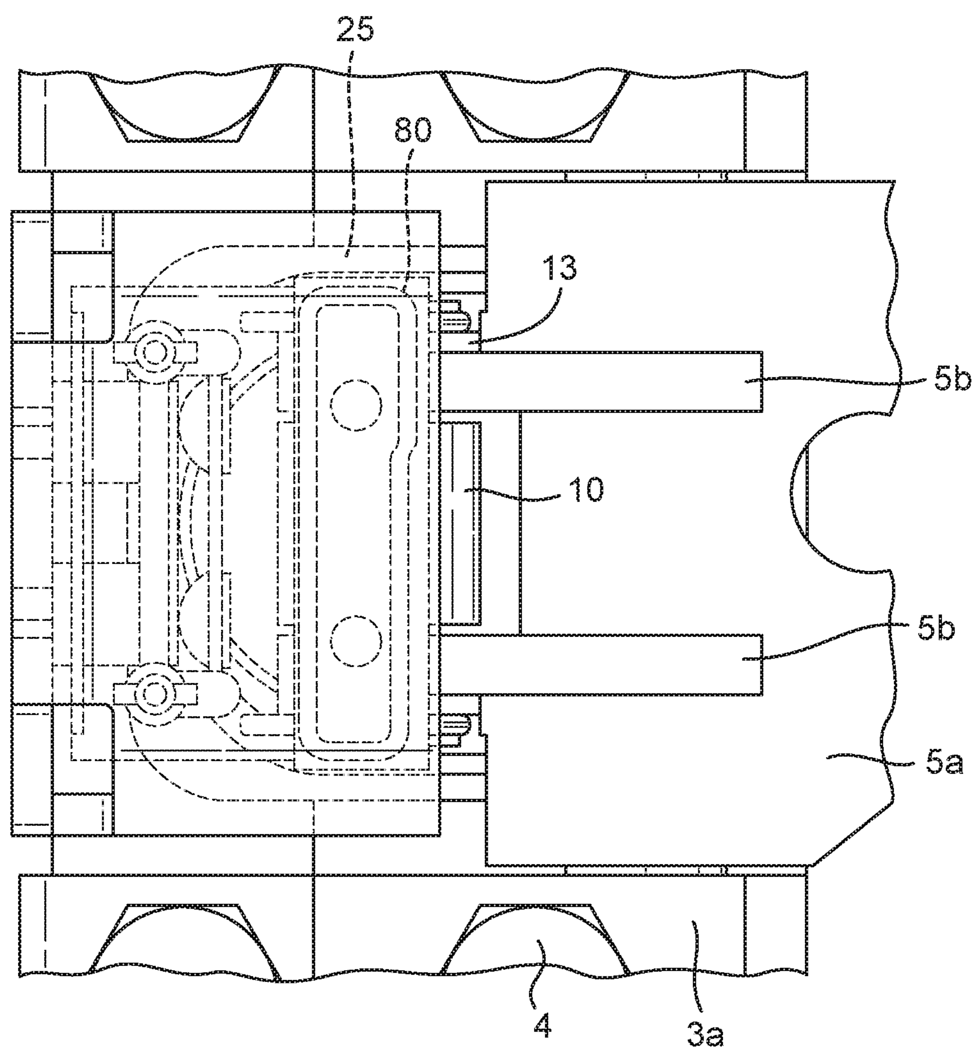
FIG. 16 is a view of the downwardly facing sensor probe.

As shown in FIG. 16, the downwardly facing sensor probe 25 is formed on the lowermost surface of the enclosure 16. In this configuration, when the sensor assembly 14 is mounted, the downwardly facing sensor probe 25 faces downwardly for sensing the crank portion 5*b* portion of the latch 5 and/or the piston head 10. In this embodiment, the downwardly facing sensor probe 25 is a closed-position proximity sensor probe that senses the latch 5 in the closed position.

The downwardly facing sensor probe 25 comprises a single spiral coil 80 having a greater extent in a direction parallel to the bracket pin 7 than in a direction rearwardly of the bracket pin 7. Hereinafter, this is referred to as a race-track coil 80. The race-track coil 80 operates as an antenna. With this shape of the race-track coil 80, the downwardly facing sensor probe 25 detects the piston head 10, washer 13 and crank portion 5*b* portion of the latch 5, around the latch pivot effort point, when the latch 5 is in the closed position. The design of the latch 5 allows for movement of the piston head 10 movement between the latch 5 pivot effort point and movement between the latch 5 and the latch bracket head 3*a*. The race-track coil 80 is designed to be longer than the total movement, and therefore is insensitive to the movement.

Figure 17:
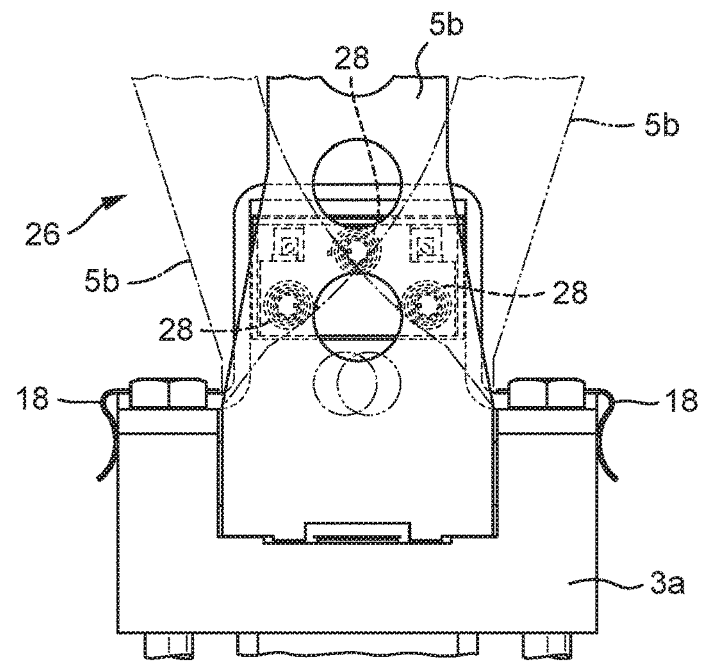
FIG. 17 is a view of the forwardly facing sensor probe.

As shown in FIG. 17, the forwardly facing sensor probe 26 is formed on the forward-facing surface 27 of the enclosure 16 (the surface facing in the same direction as the arm of the latch in the closed position, i.e. the surface 27 of the enclosure visible in each of FIGS. 10, 12, 14 and 15). In this configuration, when the sensor assembly 14 is mounted, the forwardly facing sensor probe 26 faces forwardly for sensing the arm 5*a* of the latch 5. In this embodiment, the forwardly facing sensor probe 26 is an open-position proximity sensor probe that senses the latch 5 in the open position.

Figure 4:
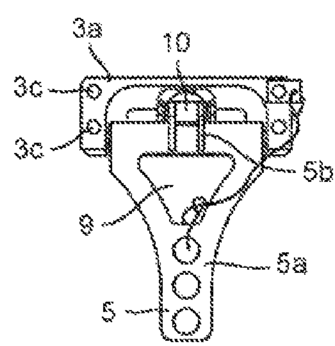
FIG. 4 is a top view of the first latch assembly (Prior Art)
Figure 5:
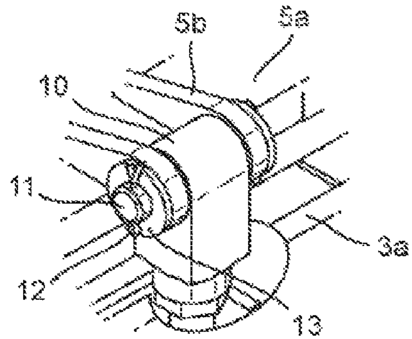
FIG. 5 is a close view of the latch pivot point, showing the various components (Prior Art)
Figure 6:
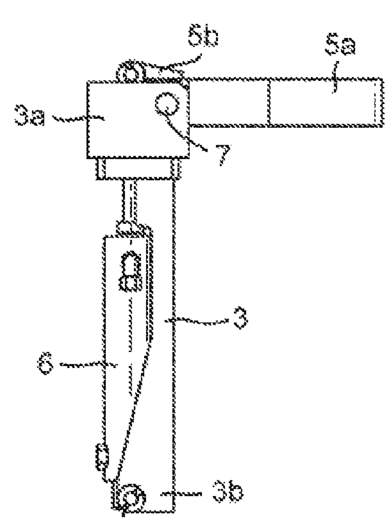
FIG. 6 is a side view of the second latch assembly (Prior Art)
Figure 7:
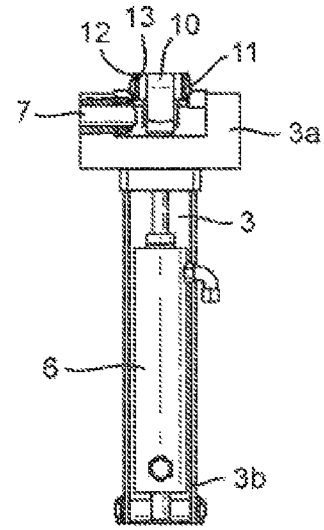
FIG. 7 is a rear view of the second latch assembly (Prior Art)
Figure 8:
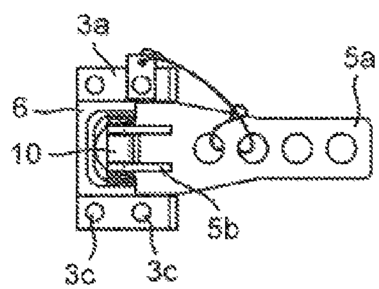
FIG. 8 is a top view of the second latch assembly (Prior Art)
Figure 9:
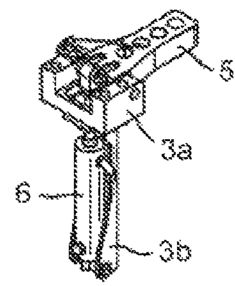
FIG. 9 is a perspective view of the second latch assembly (Prior Art)

The forwardly facing sensor probe 26 comprises three coils 28 spaced apart for sensing of arms 5*a* having different shapes. Latches 5 come in many different shapes to deal with different size tubulars. The latches 5 shown in FIGS. 4 and 8 are two examples, but many other shapes are also available. By forming the forwardly facing sensor probe 26 as plural coils 28 (in this example three coils, although in general there may be any plural number) that are spaced apart, detection is provided of different shapes of latch 5 that have a part overlapping at least one of the coils 28 in the open position. For example, FIG. 17 includes three alternative latches 5 of different shapes overlaid in the diagram showing that each of the latches 5 overlaps one of the three coils 28.

The construction of the enclosure 16 is now described in more detail. The enclosure 16 in various stages of assembly is shown in FIGS. 18 to 22 which are perspective views in which some parts are shown transparently for clarity.

The enclosure 16 is assembled as follows.

Figure 18:
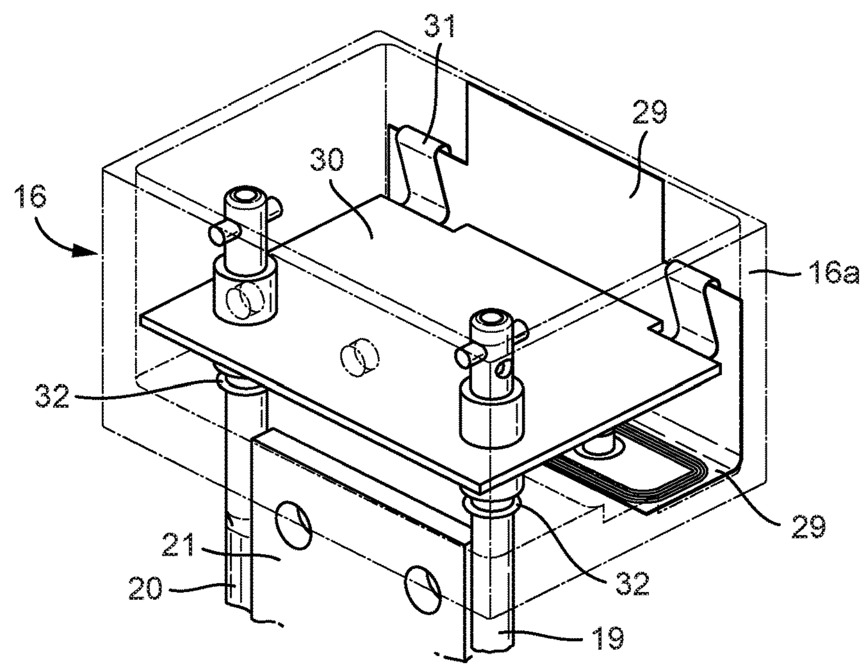
FIGS. 18 to 22 are various perspective views of the sensor enclosure, with different internal components visible.

First, the components shown in FIG. 18 are assembled. These components are as follows. The body 16*a* of the enclosure 16 is formed from PEEK (polyether ether ketone) to provide a chemically resistant, strong enclosure. At this stage the enclosure 16 has no uppermost lid, to allow access to the inside of the enclosure 16.

A flexible PCB 29 (printed circuit board) extends around the forward and lowermost surfaces of the inside of the enclosure 16. The flexible PCB 29 is attached to the enclosure 16 by adhesive tape. The coils 80 and 28 of the sensor probes 25 and 26 are etched onto the flexible PCB 29.

A rigid PCB 30 carries the sensor circuit 100 whose components are described below.

A flexible to rigid PCB connection 31 provides a permanent connection between the flexible PCB 29 and the rigid PCB 30. This provides no mechanical connection which increases durability of the connection.

The stent 19 and the support member 20 both extend into the enclosure 16. O-rings 32 are provided around the stent 19 and the support member 20 at the entry point, to stop the potting compound running out during curing and avoid moisture ingress during use.

The assembly order is:

1. Clean enclosure 16.
2. Stick flexible PCB 29 to the inside of the enclosure.
3. Insert stent assembly.
4. Insert O-rings 32.

Figure 19:
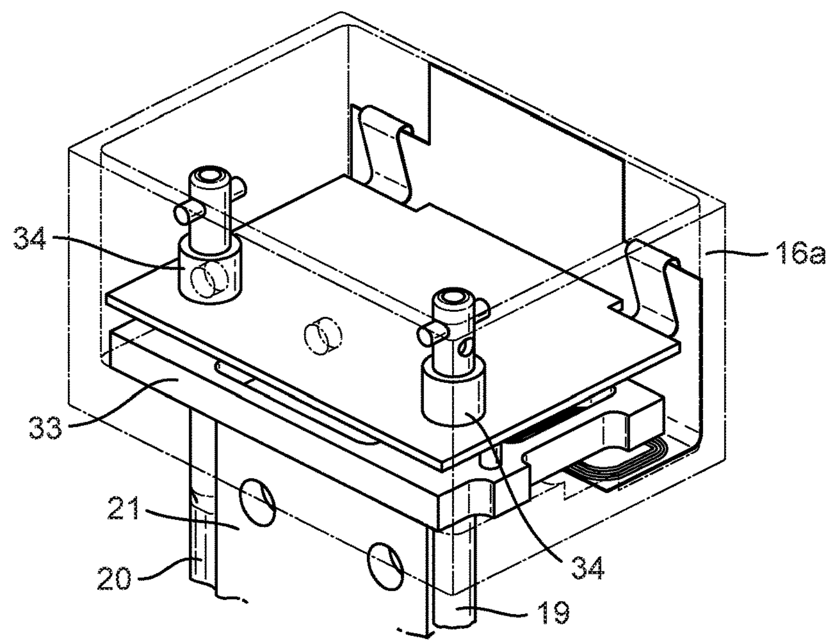

Next, the components shown in FIG. 19 are assembled. These components are as follows.

A bottom insert 33 is provided inside the enclosure below the rigid PCB 30 to mechanically hold the stent 19 and support member 20 and to support the rigid PCB 30 in place.

Solid insulation 34 is provided between the rigid PCB 30 and the stent 19 and support member 20.

The assembly order continues:

5. Insert bottom insert.
6. Fold over rigid PCB to rest on bottom insert.
7. Insert solid insulation over stent 19.
8. Solder the wires exiting the stent 19 to the rigid PCB.

Figure 20:
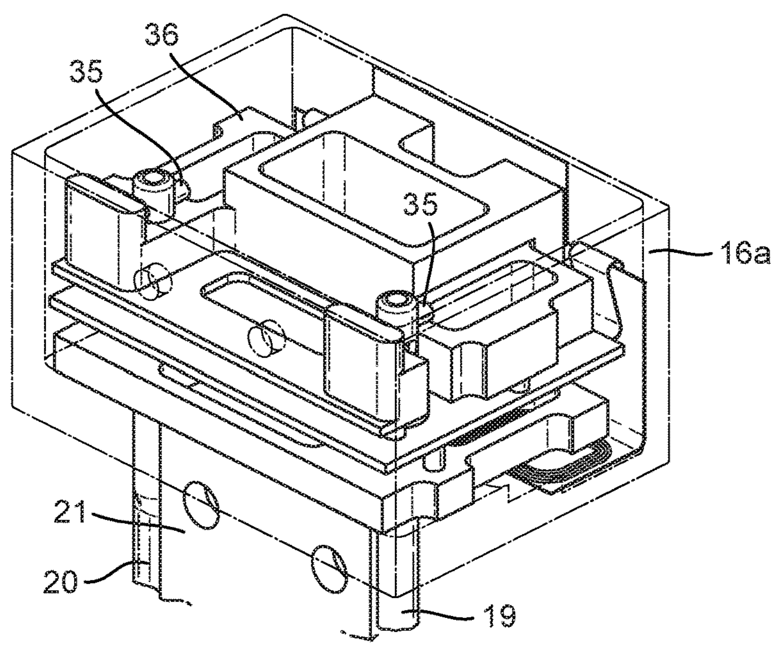

Next, the components shown in FIG. 20 are assembled. These components are as follows.

A top insert 36 is provided inside the enclosure 16 above the rigid PCB 30 to mechanically hold the stent 19 and support member 20 and to support the rigid PCB 30 in place.

Stent pins 35 mechanically hold the stent 19 and support member 20 in place The assembly order continues:

9. Insert top insert 36.
10. Insert stent pins 35.

Figure 21:
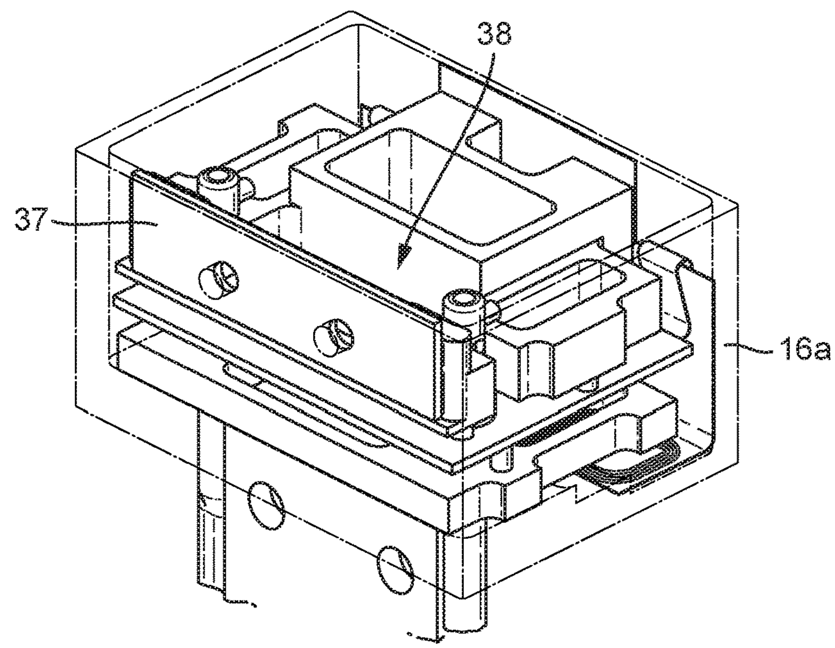
Figure 22:
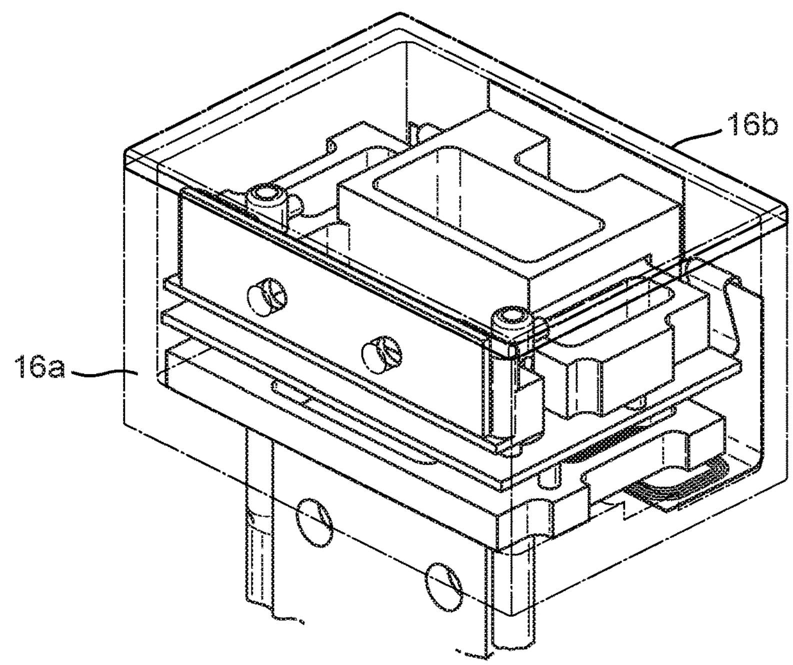

Next, the components shown in FIG. 21 are assembled. These components are as follows.

A rivet plate 37 is attached inside the rearward surface of the enclosure 16 to distribute the load of the rivets across the back face of the enclosure 16. The rivet plate 37 also has foam 38 stuck on the inside face to prevent potting compound leaking out of the enclosure 16 and to allow the rivets to expand on insertion.

The assembly order continues:

11. Insert rivet plate 37.
12. Fill enclosure 16 with potting compound to top of enclosure.
13. Wait for potting compound to set.

Finally, the components shown in FIG. 21 are assembled. These components are as follows.

A lid 16*b* is ultrasonically welded to the body 16*a* of the enclosure 16, thereby completing the enclosure 16 to protect the potting compound from chemical attack and to provide an aesthetical finish.

The assembly order continues:

14. Ultrasonically weld lid 16*b*.
15. Rivet enclosure 16 and stent assembly to bracket.

Figure 23:
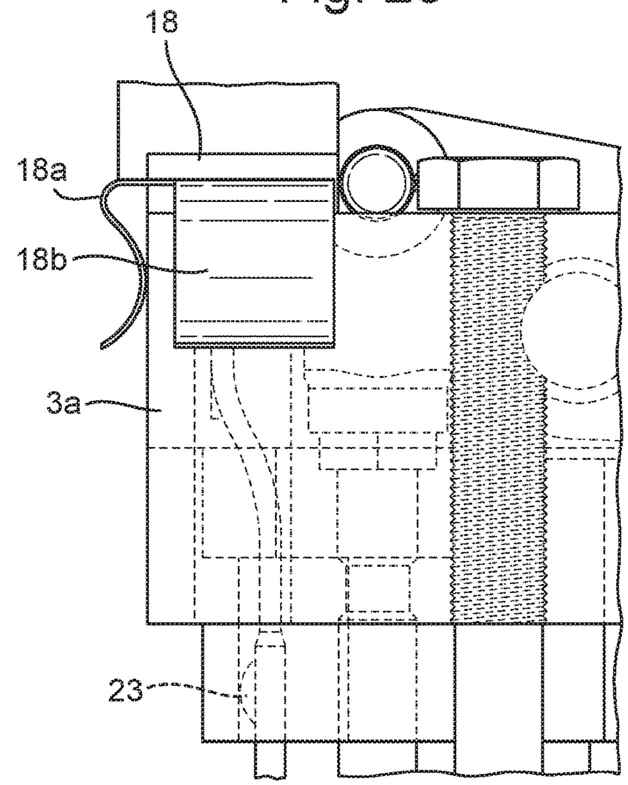
FIG. 23 is a side orthographic projection of the latch pivot point, showing the rear spring clips.
Figure 24:
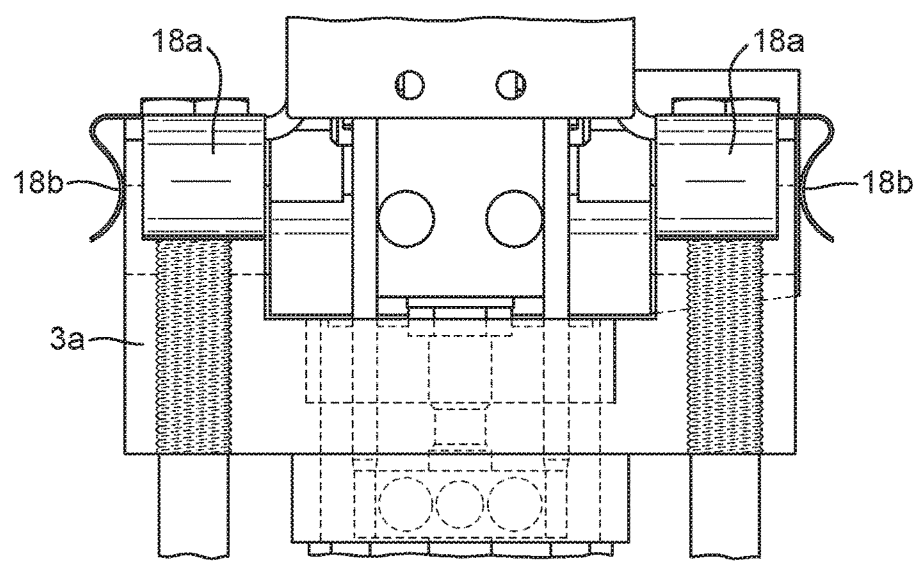
FIG. 24 is a rear orthographic projection of the latch pivot point, showing the side spring clips.

FIGS. 23 and 24 show how the spring clips 18 engage the latch bracket head 3*a* for positioning the mounting assembly.

The spring clips 18 include a rear spring clip portion 18*a* shown in FIG. 23 which engages the top of the rear wall of the latch bracket head 3*a* to provide location assistance during installation. The rear spring clip portions 18*a* urge the sensor assembly 14 backwards until the vibration dampers 23 touch the inside wall of the aperture 9 of the latch bracket head 3*a*.

The spring clips 18 include a side spring clip portion 18*b* shown in FIG. 24 which engages the top of the side wall of the latch bracket head 3*a* to provide location assistance during installation. The side spring clip portions 18*b* urge the sensor assembly 14 in opposite sideways directions to locate the sensor assembly 14 in the middle of the latch bracket head 3*a*.

Figure 25:
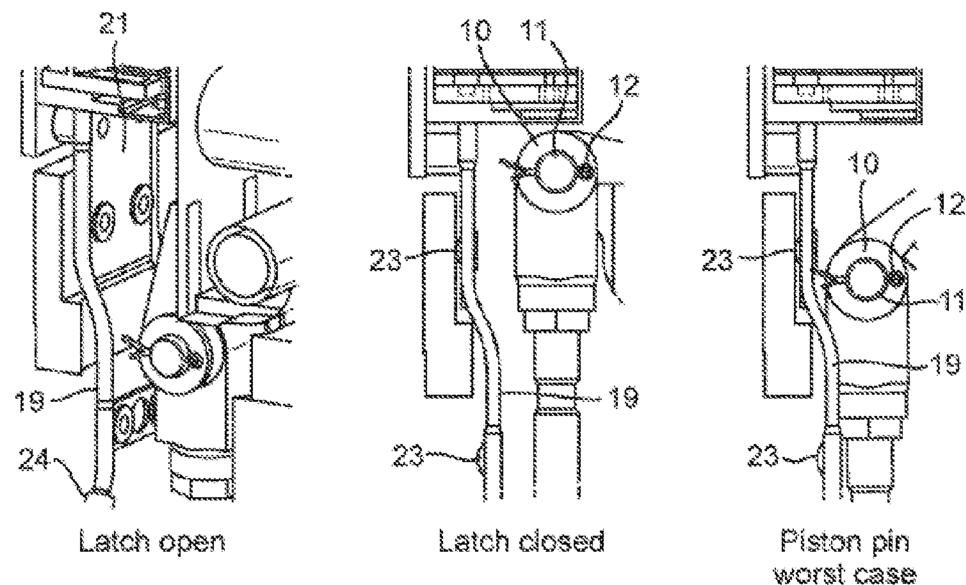
FIG. 25 is an illustration of three different latch positions for the arrangement in FIG. 14.

FIG. 25 shows the location of the stent 19 and the support member 20 when the first type of sensor assembly 14 is mounted to the first type of fingerboard latch assembly 2. Three different positions of the latch 5 are shown as follows.

The diagram 'Latch open' shows the latch 5 in the open position and the diagram 'Latch closed' shows the latch 5 in the closed position. In each case, the diagrams show the routing of the stent 19 and support member 20 inside the aperture 9 of the latch block assembly with close proximity to the rear wall of the aperture 9. In each case, the diagrams also show the top vibration dampers 23 resting against a rear surface of the aperture 9, which assists with accurate location of the stent 19, and the bottom vibration dampers 23 separated from the latch bracket head 3*a*.

The diagram 'Piston pin worst case' shows the latch 5 in a position between the open position and the closed position in which the piston head 10 and crank portion 5*b* come closest to the stent 19 and support member. However, a clearance is nonetheless provided around the stent 19 and support member 20.

Figure 26:
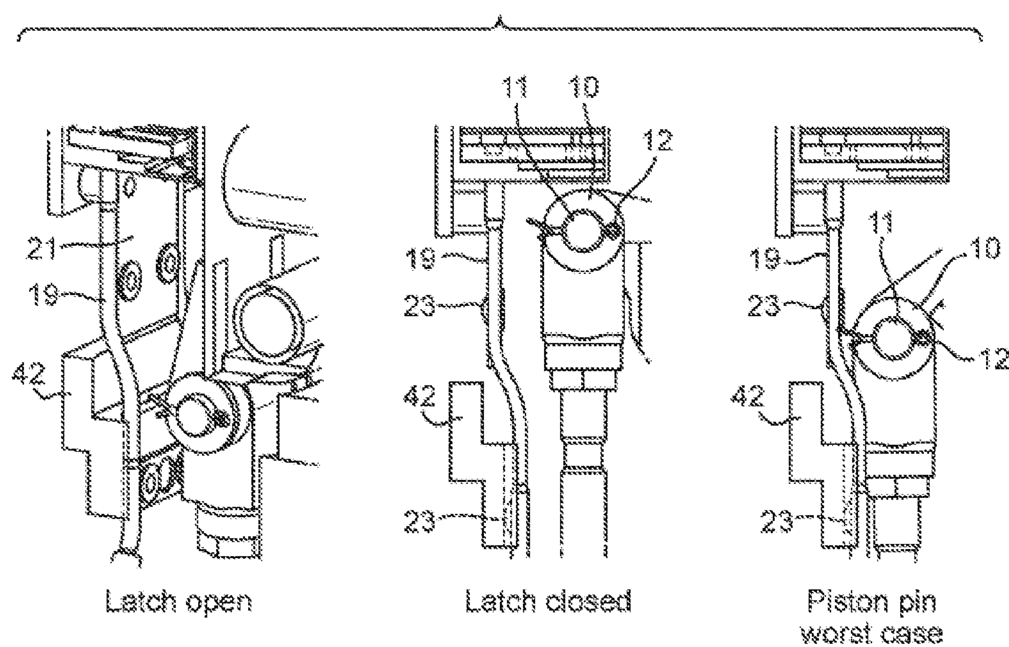
FIG. 26 is an illustration of three different latch positions for the arrangement in FIG. 15.

FIG. 26 shows the location of the stent 19 and support member 20 when the second type of sensor assembly 14 is mounted to the second type of fingerboard latch assembly 2. Three different positions of the latch 5 are shown as follows.

The diagram 'Latch open' shows the latch 5 in the open position and the diagram 'Latch closed' shows the latch 5 in the closed position. In each case, the diagrams show the routing of the stent 19 and support member 20 inside the aperture 9 of the latch block assembly with close proximity to the rear wall of the aperture 9. In each case, the diagrams also show the bottom vibration dampers 23 resting against a rear surface of the aperture 9, which assists with accurate location of the stent 19, and the top vibration dampers 23 separated from the latch bracket head 3*a*.

The diagram 'Piston pin worst case' shows the latch 5 in a position between the open position and the closed position in which the piston head 10 and crank portion 5*b* come closest to the stent 19 and support member 20. However, a clearance is nonetheless provided around the stent 19 and support member 20.

The sensor assembly 14 is mounted to the fingerboard latch assembly 2 by performing the following steps:

1. Route the external cable 42 up through the fingerboard 1 and up through the aperture 9 of the latch bracket head 3*a*.
2. Remove two rear bolts 4 from the latch bracket head 3*a* and insert through the sensor bracket 15.
3. Connect the external cable harness to the M12 connector 24
4. Guide the stent 19 and support member 20 of the sensor assembly 14 down through the aperture 9 in the latch bracket head 3*a* and locate the sensor bracket 15 on the latch bracket head 3*a*.
5. Insert the bolts 4 through the sensor bracket 15 and latch bracket head 3*a* and tighten.

Figure 27:
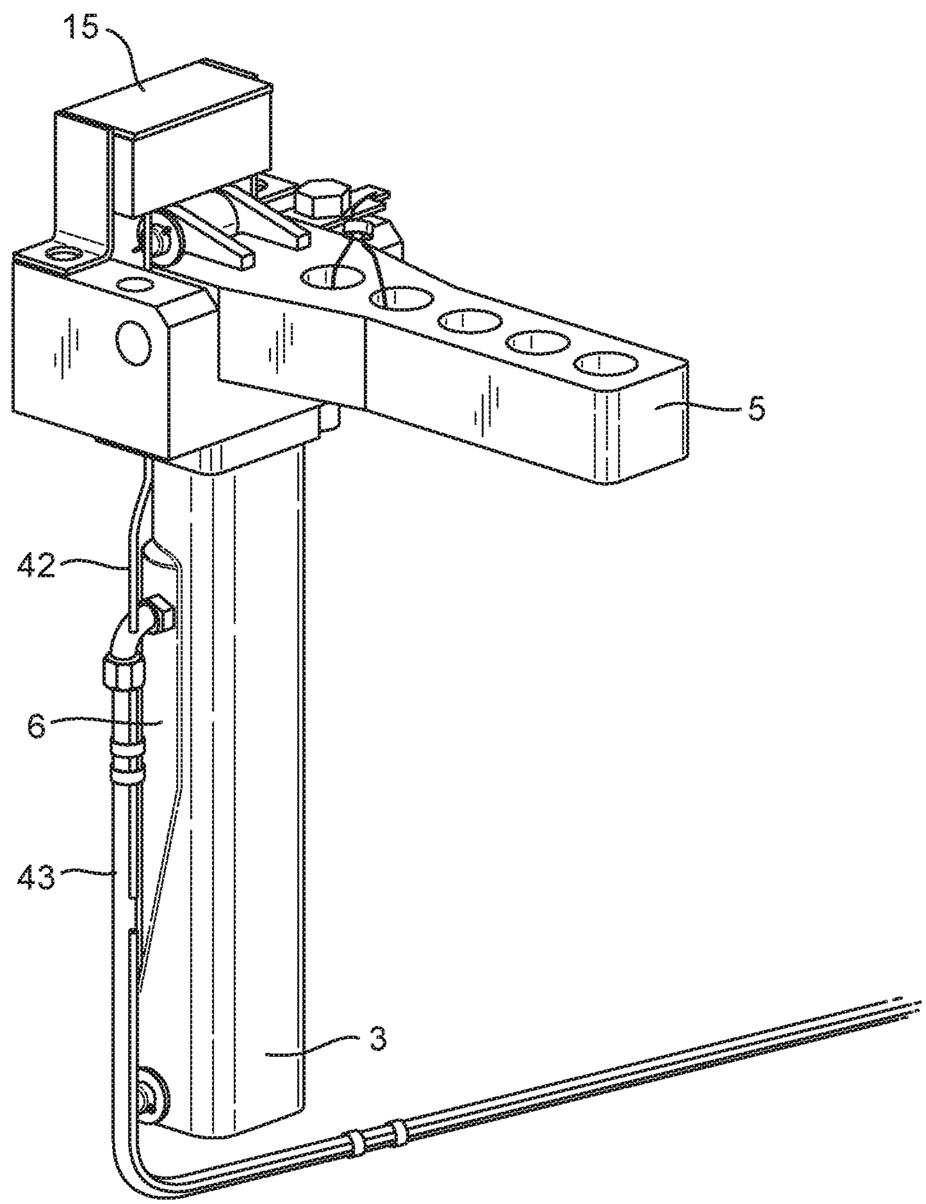
FIG. 27 is a diagram showing how the external cable is routed with the pneumatic hoses.

The external cable 42 is routed through the fingerboard 1 along the same channels as pneumatic hoses 43 which are connected to the pneumatic cylinder 6, as shown in FIG. 27.

The sensor circuit 100 that is connected to the downwardly facing sensor probe 25 and to the forwardly facing sensor probe 26 will now be described.

Figure 28:
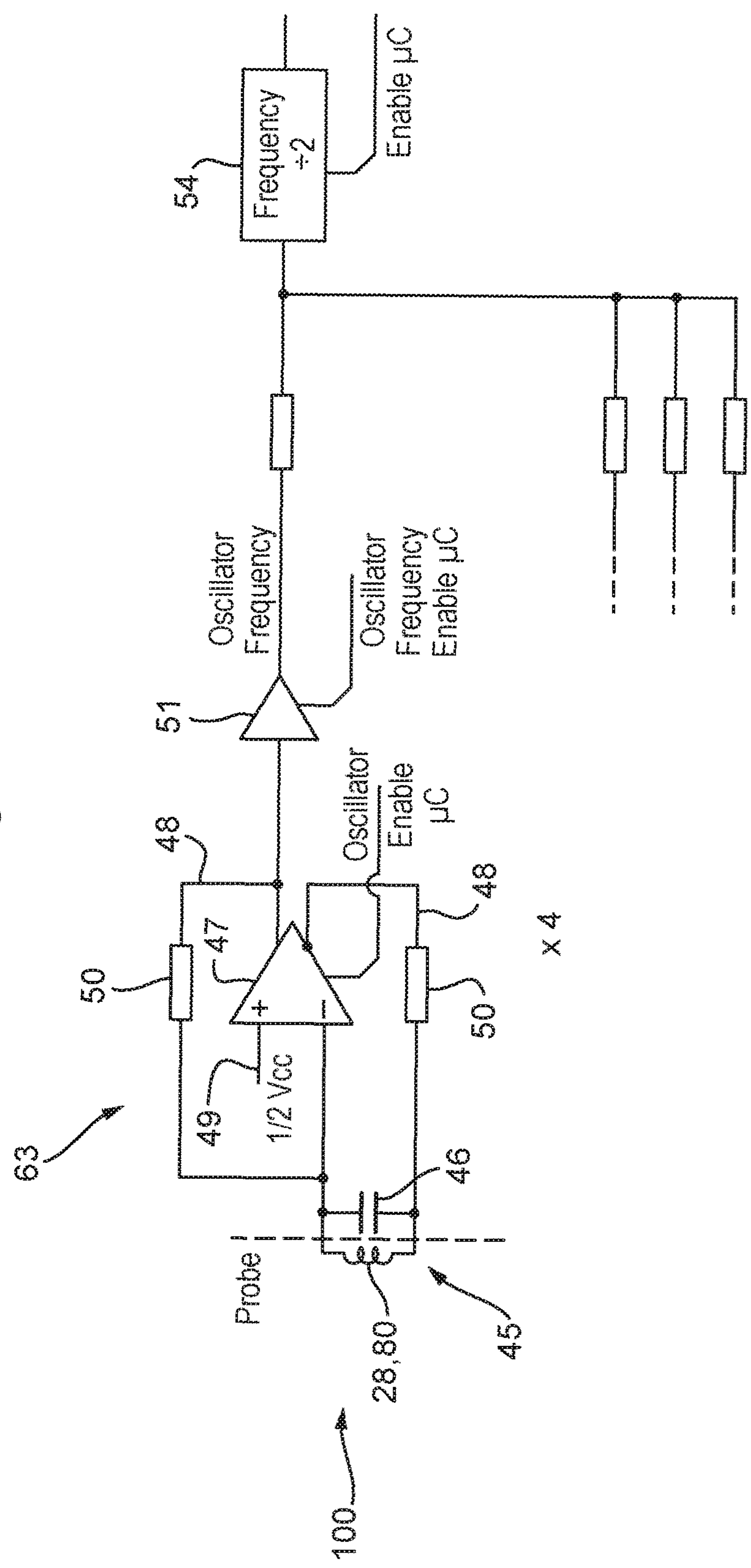
FIG. 28 is a diagram of the electronic circuit connected to a sensor probe.
Figure 29:
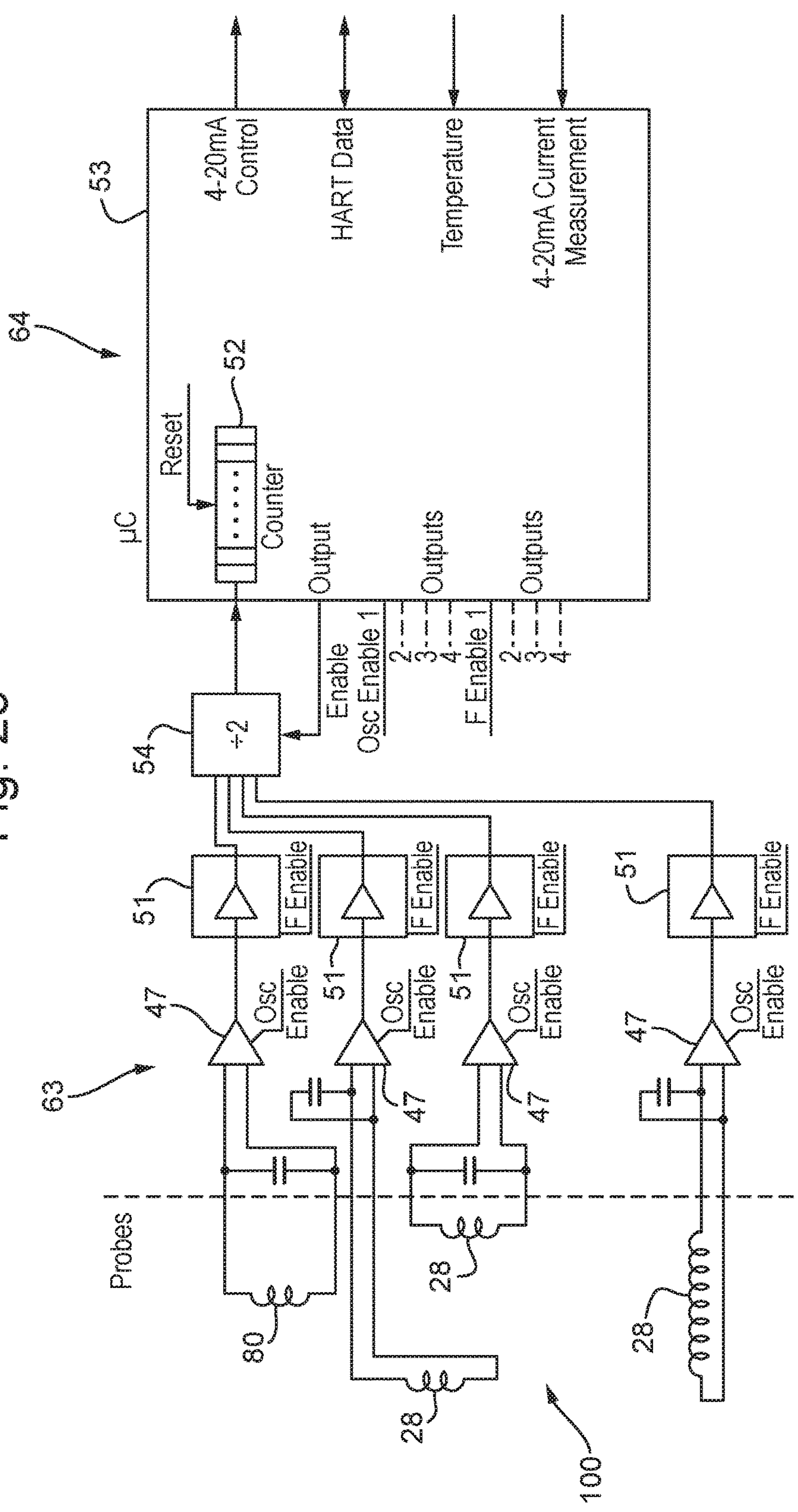
FIG. 29 is a schematic showing the sensor circuit including connections between all the sensor probes.

FIG. 28 shows part of the sensor circuit 100 in respect of one of the coils 80 or 28 and FIG. 29 shows the sensor circuit 100 in respect of all the coils 80 and 28.

Each coil 80 or 28 is connected in parallel with a capacitor 46 to form a tank circuit 45. Although in this example, the probes 25 and 26 comprise an inductive element, i.e. a coil 80 or 28, in general, the tank circuit 45 could include any arrangement of inductive element and capacitive elements, one of which forms the probe.

The sensor circuit 100 includes an oscillator circuit 63 which in this example is a marginal oscillator. The oscillator circuit 63 is arranged to drive oscillation in the coil 80 or 28. The oscillator circuit 63 includes a non-linear drive circuit implemented by a limiter 47. The limiter 47 provides differential signaling in that it outputs a differential signal pair of complementary signals 48. The complementary signals 48 are each formed with respect to a common ground, but in anti-phase with each other, although they may have unbalanced amplitudes. Thus, the overall signal appearing across the tank circuit 45 is the difference between the complementary signals 48 and is independent of the ground.

The limiter 47 is supplied with a single one of the complementary signals 48, which is DC coupled to one of the inputs of the limiter 47. The other input 49 of the limiter 47 is supplied with a fixed voltage of half the bias voltage. The limiter 47 amplifies and limits that one of the complementary signals 48 to provide the differential signal pair.

The differential signal pair of complementary signals 48 output by the limiter 47 are supplied across the tank circuit 45 through a current source stage formed by a pair of resistors 50 that operate as current sources and each receive one of the limited outputs. Thus, the current source stage converts the voltage of the input into a current. As an alternative to the resistors 50, the current sources could be another type of passive element, for example a capacitor, or an active component such as a semiconductor device or an amplifier. The feedback of the complementary signals 48 from the tank circuit 45 to the limiter 47 is positive and in combination with the action of the limiter 47 builds up and sustains the oscillation of the tank circuit 45 at the natural frequency of the tank circuit 45.

Differential signaling on the output of the limiter 47 provides fast guaranteed oscillator start up. Using complementary signals 48 with unbalanced amplitudes, using a stronger feedback on the non-inverting output, means that the limiter 47 will self-oscillate providing a stimulus for the tank circuit 45 to start oscillating.

The differential signaling also allows for fault detection. In the event of the coil 80 or 28 becoming open circuit there will be no oscillation, and in the event of the coil 80 or 28 becoming shorted or the capacitor 46 failing open or short, the oscillator will oscillate at a very high frequency. Both of these fault states can be sensed to provide fault detection.

The oscillator circuit 63 may be a Robinson marginal oscillator in which the non-linear drive circuit comprises a separate gain stage and limiter stage, and may have the construction disclosed in detail in PCT/GB2014/051886 which is incorporated herein by reference.

The sensor circuit 100 also includes a detection circuit 64 arranged to detect the frequency of the oscillation in the tank circuits 45. That frequency is a characteristic of the oscillation that is dependent on the electromagnetic properties of the tank circuits 45, in particular of the coils 80 or 28. Hence the detected frequency varies in dependence on the position of the sensed component (latch 5 and/or piston head 10), thereby being a signal that represents the position of the latch 5.

In general, other characteristics of the oscillation, such as the amplitude, could alternatively or additionally be detected.

In particular, the detection circuit 64 comprises a frequency counter 52 that is arranged to detect the frequency of the oscillation in the tank circuit 45. The frequency counter 52 is implemented in a microcontroller 53. The frequency counter 52 is supplied with one of the outputs of the limiter 47 in respect of each coil 80 or 28.

The oscillator circuits 63 of the coils 80 or 28 are operated in a time sequential manner so that only one is enabled any one time to preserve power. The limiters 47 have an enable pin which is controlled to power down the oscillator circuit 63.

A single frequency counter 52 is provided for each coil 80 or 28. The signals in respect of each coil 80 or 28 are provided through respective tri-state buffers 51 that are controlled to prevent spurious frequency readings from being measured from oscillators that are not enabled. The buffers 51 provide a high to low impedance path for the output and therefore do not put unnecessary loading on the oscillator circuit 63.

The signals are supplied to frequency counter 52 through a flip-flop 54 that divides the frequency by two to reduce power consumption and to bring the oscillation frequency down for convenient implementation of the frequency counter 52 in the microcontroller 53.

The frequency range of operation is as follows. Each oscillator circuit 63 has a natural frequency at which oscillation occurs that is dependent on the inductance of the coil 80 or 28 and the capacitance of the parallel capacitor 46. The frequency is chosen to provide a variation in the oscillation frequency between the open and closed positions. For example, the frequency may be selected to be about 30 MHz. Preferably, the frequency is separated from 25 MHz because that is a commonly used frequency used on offshore drilling platforms.

With this type of sensor including probes 25 and 26 that are inductive probes and an oscillator circuit 63 which is a marginal oscillator, the range of operation of the sensor arrangement is approximately the overall diameter of the coils 80 or 28 which for the both the latch open and closed condition coils is about 10 mm. Beyond 10 mm the signal to noise ratio is too low to make use of the readings, unless further noise reduction is implemented.

As described above, the detected frequency output by the frequency counter is a position signal that represents the position of the latch 5. A processor, which may be the microcontroller 53 or an external processor 70, may process this signal. The external processor 70 may be of any type, for example a conventional PC. The processing may be implemented by the external processor 70 executing a computer program.

When the sensor probes 25 and 26 are used as proximity sensor probes, the position signal may be used to detect proximity of the sensed component (latch 5 and/or piston head 10) to the sensor probes 25 and 26, i.e. whether the latch 5 is in the closed position or the open position, respectively. The position signal may be used to determine other parameters of the motion of the latch 5 from the measured frequency, for example speed, acceleration, overshoot, vibration and offsets. Such parameters may be further processed to analyze and predict latch behavior, condition and predict failure. This is useful information for predictive maintenance.

Figure 30:
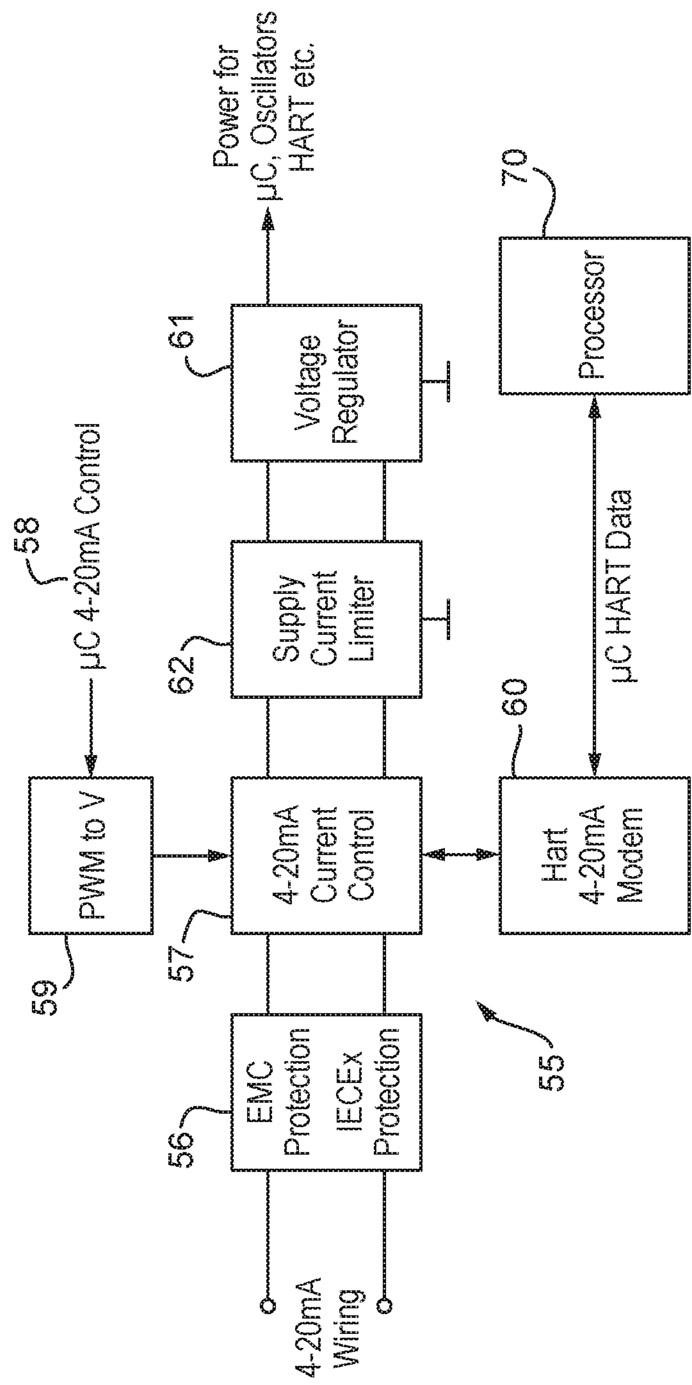
FIG. 30 is a block diagram illustrating the power and communication circuit.

Besides the sensor circuit 100, a power and communication circuit 55 shown in FIG. 30 is also implemented on the rigid PCB 30 inside the enclosure, as follows.

The sensor circuit 100 is powered and communicates via 2 wires (using standard analog 4-20 mA signaling). The interface is known as a 4-20 mA current loop. The sensor circuit 100 controls the amount of current that the sensor circuit 100 uses, this current being monitored by the user of the sensor circuit 100. Predetermined current levels are used to indicate specific states of the latch 5, for example signaling the latch states by the following current draws:

14-16 mA—Latch 5 open 16-18 mA—Latch 5 between open and closed 18-20 mA—Latch 5 closed Other currents draws may be used to signal faults with the sensor circuit 100 or wiring.

To implement this the power and communication circuit includes the following elements.

The external power signal is supplied through EMC and IECEx protection 56, to protect the sensor against EMC (electromagnetic compatibility) threats and to protect the sensor from generating sparks (in accordance with standards set by IECEx).

The external power is supplied through a 4-20 mA Current Control block 57, which varies the current draw under the control of the microcontroller 53. The output of the microcontroller 58 is a PWM (pulse width modulation) signal so a PWM to Voltage converter 59 is provided between the microcontroller 53 and the 4-20 mA Current Control block 57.

The 4-20 mA Current Control block 57 is also controlled by a HART (Highway Addressable Remote Transducer) modem 60 for sending and receiving digital data, for example to and from an external processor 70. The HART modem 60 may be used to transmit the measured frequency, and/or parameters of the motion of the latch 5 where determined by the microcontroller to an external processor 70. The HART modem 60 may also be used to transmit diagnostics information about the condition of the fingerboard latch assembly 2. The diagnostics that the sensor assembly 14 could collect would be the opening and closing transient waveforms which could indicate possible failure of the latch mechanism.

The external power is supplied through a 4-20 mA Current Control 57 block to a voltage regulator 61 through a supply current limiter 62 that limits the amount of current available to the voltage regulator 61. This is in case the sensor develops a fault, and prevents the sensor drawing a level of current that might be recognized as a valid latch state.

The voltage regulator 61 is built from a switch mode power supply (SMPS) and a linear regulator. The SMPS efficiently reduces the input voltage and the linear regulator smoothes the output of the SMPS to provide a clean stable supply.

As discussed above, the oscillator circuits 63 time sequentially operated to reduce the overall power consumption, which also allows more signaling headroom for the 4-20 mA signaling.

In the above example, the sensor circuit 100 operates as a proximity sensor and the proximity sensor probes 80 or 28 are proximity sensor probes thereof. However, this type of sensor is not limitative and other types of sensor could be provided as follows. In general, the sensor may be any type of position sensor that detects the position of the latch 5. The sensor may be a proximity sensor that detects proximity of a portion of the latch 5 to the sensor probe 25 or 26.

Although the probes 25 and 26 comprise coils 80 or 28 in the above examples, more generally the probe 25 or 26 may be any type of electromagnetic probe, for example an antenna. In general, the electromagnetic probe may be capacitive and/or inductive.

Forming the oscillator circuit 63 as a marginal oscillator provides advantages of good range and stable operation, but in general the sensor could use probes 25 and 26 as described above but with a different type of oscillator circuit 63. In general any type of oscillator circuit 63 could be used so as long as the active device could sustain the frequency of operation. Ideally good frequency stability would be provided so that only the sensed components of the fingerboard latch assembly 2 change the frequency. Some oscillator topologies have inter-element capacitances for example if a transistor is operating in the non-linear portion of its characteristics, there may be variations in transistor parameters which in turn affect the oscillator frequency.

In general the main temperature dependent component in the circuit is the tank capacitor, which has been chosen to have a low temperature coefficient. This capacitor does have a slight effect on the accuracy of the circuit therefore a thermistor may be placed to measure the temperature of the electronics and compensate the readings accordingly.

Alternatively, other types of sensor based on other sensing technologies could be used. In that case the probes 25 and 26 may be replaced by a sensor probe appropriate to the sensing technology.

Examples of alternative types of sensor that could be used are as follows: infrared; laser; acoustic; capacitive; magnetic or Hall Effect sensors.

The invention claimed is:

1. A sensor system for a fingerboard latch assembly including a latch, the sensor system comprising:

a processor;

a sensor assembly including at least one sensor arranged to sense a position of the latch;

a sensor circuit connected to the at least one sensor and arranged to derive a signal representing the position of the latch; and a communication circuit arranged to communicate the signal representing the position of the latch;

wherein the processor is arranged to determine at least one parameter of motion of the latch from the signal representing the position of the latch, wherein the at least one parameter of motion includes at least one of:

speed of the latch;

acceleration of the latch;

overshoot of the latch; and vibration of the latch.

2. The sensor system according to claim 1, wherein the processor is further arranged to analyze the determined parameter of motion of the latch and on the basis thereof making a prediction, wherein the prediction includes:

failure of the latch.

3. The sensor system according to claim 1, wherein the processor is further arranged to analyze the determined parameter of motion of the latch and on the basis thereof making a prediction, wherein the prediction includes:

behavior of the latch.

4. The sensor system according to claim 1, wherein the processor is further arranged to analyze the determined parameter of motion of the latch and on the basis thereof making a prediction, wherein the prediction includes:

a condition of the latch.

5. The sensor system according to claim 1, wherein the sensor system further comprises:

a mounting arrangement that is mountable to the fingerboard latch assembly, wherein the at least one sensor is held by the mounting arrangement, wherein the sensor system is configured so that, when mounted, the sensor is arranged to sense the position of the latch.

6. The sensor system according to claim 5, wherein the at least one sensor includes at least one proximity sensor probe arranged to sense proximity of a portion of the latch.

7. The sensor system according to claim 5, wherein the mounting arrangement includes a rigid sensor bracket that is mountable to a pair of bolts on opposite sides of the fingerboard latch assembly, wherein the at least one sensor includes:

a closed-position proximity sensor probe that is configured to face downwardly when the sensor assembly is mounted to sense proximity of at least one of a crank portion of the latch and a piston head in a closed position; and an open-position proximity sensor probe that is configured to face forwardly when the sensor assembly is mounted to sense proximity of the arm of the latch in an open position.

8. A method of sensing a fingerboard latch assembly that includes a latch, the method comprising:

sensing a position of the latch for deriving a signal representing the position of the latch;

utilizing a processor for determining at least one parameter of motion of the latch from the signal representing the position of the latch, wherein the at least one parameter includes at least one of:

speed of the latch;

acceleration of the latch;

overshoot of the latch; and vibration of the latch.

9. The method according to claim 8, further comprising;

utilizing the processor for analyzing the determined parameter of motion of the latch; and on the basis of analyzing the determined parameter of the motion of the latch, utilizing the processor for making a prediction, the prediction including:

failure of the latch.

10. The method according to claim 9, wherein the prediction further includes:

behavior of the latch.

11. The method according to claim 9, wherein the prediction further includes:

a condition of the latch.

* * * * *